United States Patent
Kaneko et al.

[11] Patent Number: 6,052,913
[45] Date of Patent: Apr. 25, 2000

[54] POSITIONING DEVICE AND POSITIONING METHOD

[75] Inventors: Satoshi Kaneko, Chikushino; Katuki Yamasaki, Kurume, both of Japan

[73] Assignee: Tokyo Electron Limited, Japan

[21] Appl. No.: 09/115,289

[22] Filed: Jul. 14, 1998

[30] Foreign Application Priority Data

Jul. 15, 1997 [JP] Japan ................................. 9-203926

[51] Int. Cl.$^7$ .................................................. A51H 24/00
[52] U.S. Cl. ............................... 33/645; 33/533; 414/936
[58] Field of Search ........................... 33/645, 613, 533, 33/286; 414/935, 936

[56] References Cited

U.S. PATENT DOCUMENTS

| | | | |
|---|---|---|---|
| 4,873,217 | 10/1989 | Engelbrecht | 414/936 |
| 4,887,904 | 12/1989 | Nakazato et al. | 414/936 |
| 5,102,291 | 4/1992 | Hine | 414/936 |
| 5,822,213 | 10/1998 | Huynh | 33/520 |
| 5,851,102 | 12/1998 | Oakawa et al. | 414/936 |

FOREIGN PATENT DOCUMENTS

5-218179  8/1993  Japan .

Primary Examiner—Christopher W. Fulton
Attorney, Agent, or Firm—Graham & James LLP

[57] ABSTRACT

This invention relates to a device for simultaneously centering a plurality of substrates, particularly semiconductor wafers W.

A plurality of turntables 23 for supporting the semiconductor wafers W are arranged at a predetermined spacing in the vertical direction. All of the turntables 23 are driven by a single, common servo motor 28. Clutches 26 for each of the turntables 23 are disposed on rotational shafts 38a and 38b that are driven by the servo motor 28. A drive pulley 41 is attached to an output side of each clutch 26 and each drive pulley 41 drives the corresponding turntable 23 via a belt. A sensor device 29 for detecting a notch formed in the peripheral edge of each semiconductor wafer W is disposed on an outer side in the radial direction of each of the turntables 23.

A wafer W is placed on each of the turntables 23 and is centered. The servo motor 28 operates in a state in which the clutches 26 are connected, so that all of the turntables 23 start to rotate simultaneously. As a CPU 30 receives notch detection signals from each of the sensor devices 29, it sequentially disengages the clutches 26 corresponding to those turntables 23.

This invention makes it possible to simplify the structure of the device and make it more compact.

14 Claims, 10 Drawing Sheets

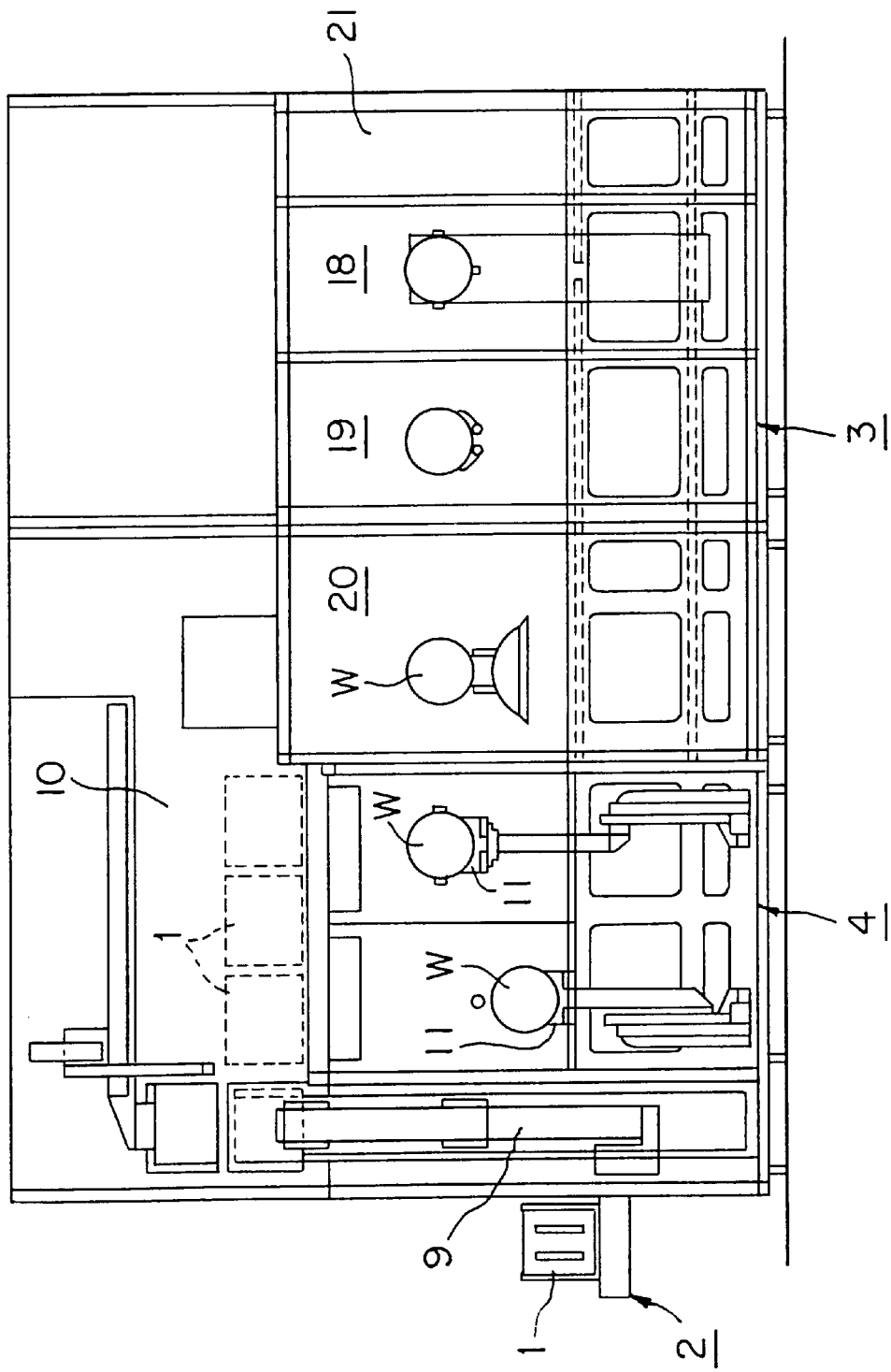
F I G. 2

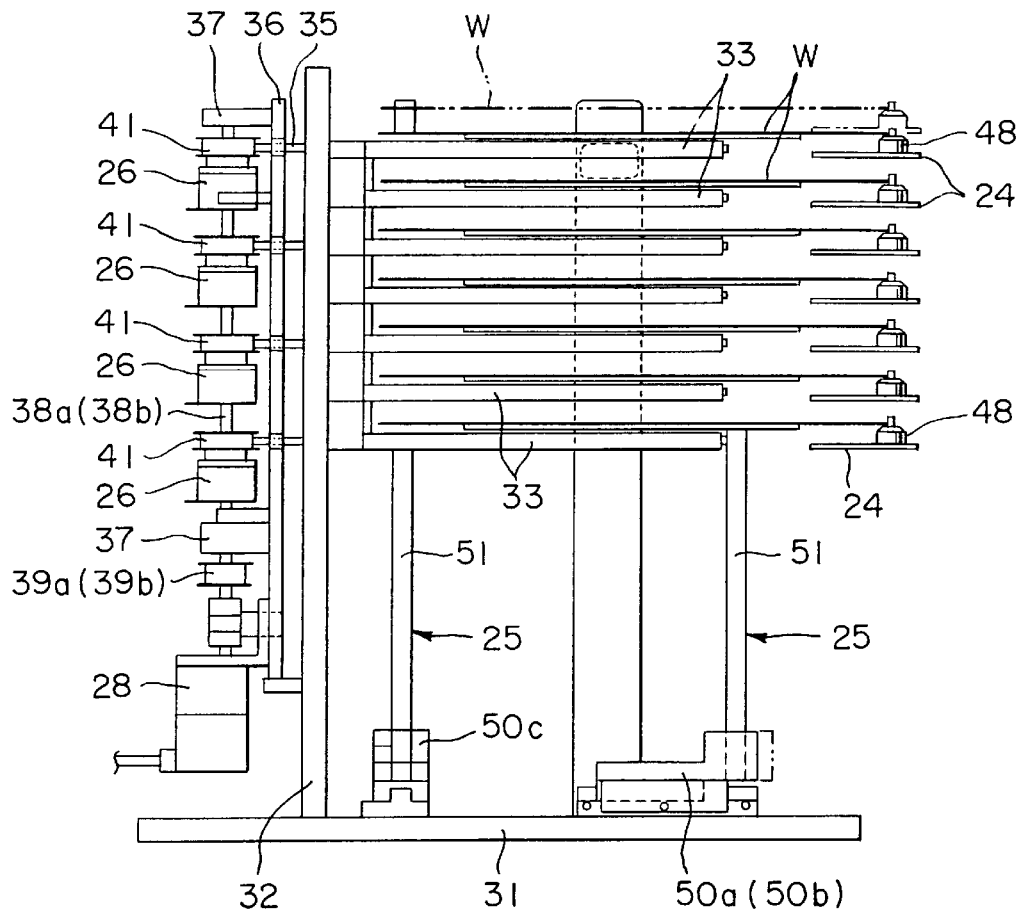
F I G. 4

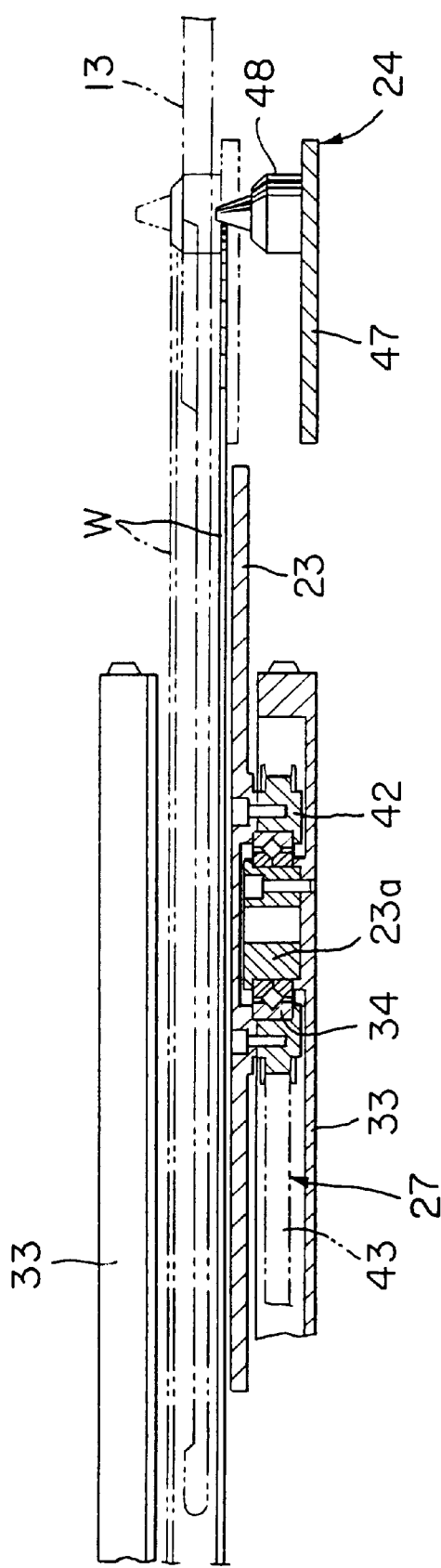
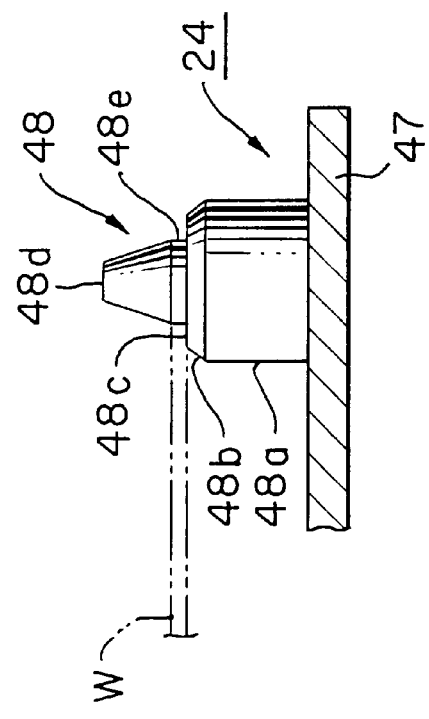
FIG. 5(a)
FIG. 5(b)

POSITIONING DEVICE AND POSITIONING METHOD

BACKGROUND OF THE INVENTION

1. Field of the Invention

The present invention relates to a positioning device and a method for simultaneously positioning a plurality of substrates, such as semiconductor wafers.

2. Description of the Related Art

During the process of fabricating a semiconductor device, a substrate conveyor and processing apparatus is widely used to convey a substrate to be processed, such as a semiconductor wafer or glass LCD (liquid crystal display) substrate, into a processing tank in which is stored a processing liquid such as a chemical or rinse (washing liquid) and then into a drying portion, to perform processes thereon such as washing and drying.

The description below concerns a substrate conveyor and processing apparatus that is an apparatus for washing and drying semiconductor wafers. In this type of apparatus, there is generally a line of a plurality of processing units and washing units for conveyor devices disposed between an inlet portion for carriers containing unprocessed wafers and an outlet portion for carriers containing processed wafers.

To wash a large number of wafers, such as about 50 wafers, efficiently in such a substrate conveyor and processing apparatus, the wafers are conveyed in a vertical orientation, which is a suitable method for conveying the wafers into and out of each of the processing units.

However, recent advances in higher levels of integration of smaller components and greater levels of mass-production have led to an increase in size of wafers from 8 inches to 12 inches. This increase in diameter of the wafers, together with the resultant increase in weight thereof, has raised a problem in that, if the wafers are conveyed within each carrier in the conventional vertical state, positional slipping will occur when the wafers are transferred between the inlet or outlet portion and the processing units, causing particles to be generated by the movement of the wafers and other parts, and thus reducing the fabrication yield.

As a result of intense research intended to solve this problem, the present inventors and applicants have developed a technique of conveying a plurality of wafers, such as 50 wafers, in a horizontal state then changing the attitude of those wafers to a vertical state before they are conveyed into the processing units.

When it comes to changing the attitude of a plurality of wafers from a horizontal state to a vertical state, it is necessary to position all of the wafers in order to align them. A positioning device in which a wafer is placed on a turntable and a notch in the wafer is detected by a sensor is known as means for positioning the wafers (refer to Japanese Patent Application Laid-Open No. 5-218179).

However, this method can only detect the position of a single wafer, During the simultaneous positioning of a plurality of wafers in a horizontal state, it is necessary to place all of the wafers with the centers of rotation thereof aligned, and detect the notches thereof under the same conditions. Therefore, if a conventional detection device is used therefor, the structure of the positioning device will become larger and more complicated, and also the task of positioning the wafers will become laborious.

SUMMARY OF THE INVENTION

An objective of the present invention is to provide a positioning device and method which enable the simultaneous positioning of a plurality of substrates that are disposed in a horizontal state, and which also make it possible to design a more compact apparatus with a simpler configuration.

In order to achieve the above objective, a first aspect of the present invention relates to a positioning device for positioning a plurality of substrates, each having a cut-away portion incision in a peripheral edge thereof, wherein the positioning device contains a plurality of turntables disposed at a predetermined spacing in the vertical direction, on each of which is to be placed one of the substrates; a centering device for centering the substrates placed on the turntables; a drive motor for generating a driving force for rotationally driving the turntables; a driving-force transmission mechanism for transmitting the driving force generated by the drive motor to each of the turntables, wherein the driving-force transmission mechanism includes a plurality of clutches provided in correspondence with the turntables in such a manner that the clutches are capable of independently interrupting and connecting the driving force with respect to each of the turntables; a plurality of sensor devices disposed in the vicinity of peripheral edges of the substrates placed on the turntables, for detecting the cut-away portion of the substrates; and a control device for controlling the clutches on the basis of detection signals from the sensors.

A second aspect of the present invention relates to a method of positioning a plurality of substrates, each having a cut-away portion in a peripheral edge thereof, wherein the method includes the steps of: centering and placing a substrate on each of a plurality of turntables; transmitting a driving force of one drive motor to the turntables, to cause the turntables to rotate; detecting the cut-away portion of the substrates on each of the turntables; and interrupting the transmission of the driving force from the drive motor to one of the turntables on which is placed a substrate wherein the cut-away portion has been detected, to halt the rotation of the turntable.

A third aspect of the present invention relates to a method of positioning a plurality of substrates, each having a cut-away portion in a peripheral edge thereof, wherein the method includes the steps of: centering and placing a substrate on each of a plurality of turntables; transmitting a driving force of one drive motor to the turntables, to cause the turntables to rotate at a first rotational velocity; detecting the cut-away portion of the substrate on each of the turntables; interrupting the transmission of the driving force from the drive motor to one of the turntables on which is placed a substrate wherein the cut-away portion has been detected, to halt the rotation of the turntable; after all of the turntables have been halted, transmitting the driving force of the drive motor to the turntables to rotate all of the turntables at a second rotational velocity that is slower than the first rotational velocity; detecting the cut-away portion of the substrate on each of the turntables; and interrupting the transmission of the driving force from the drive motor to one of the turntables on which is placed a substrate wherein the cut-away portion has been detected, to halt the rotation of the turntable.

BRIEF DESCRIPTION OF THE DRAWINGS

FIG. 2 is a schematic side view of the cleaning/drying system of FIG. 1;

FIG. 4 is a schematic side view of the positioning device of FIG. 3;

FIG. 5A is a cross-sectional view through a turntable and guide of the positioning device of FIG. 3, and FIG. 5B is an enlargement of the support protrusion of the guide of FIG. 5A;

DESCRIPTION OF THE PREFERRED EMBODIMENT

The description first concerns the overall configuration of a cleaning/drying system for semiconductor wafers that is provided with the positioning device of this invention.

Figure 1:
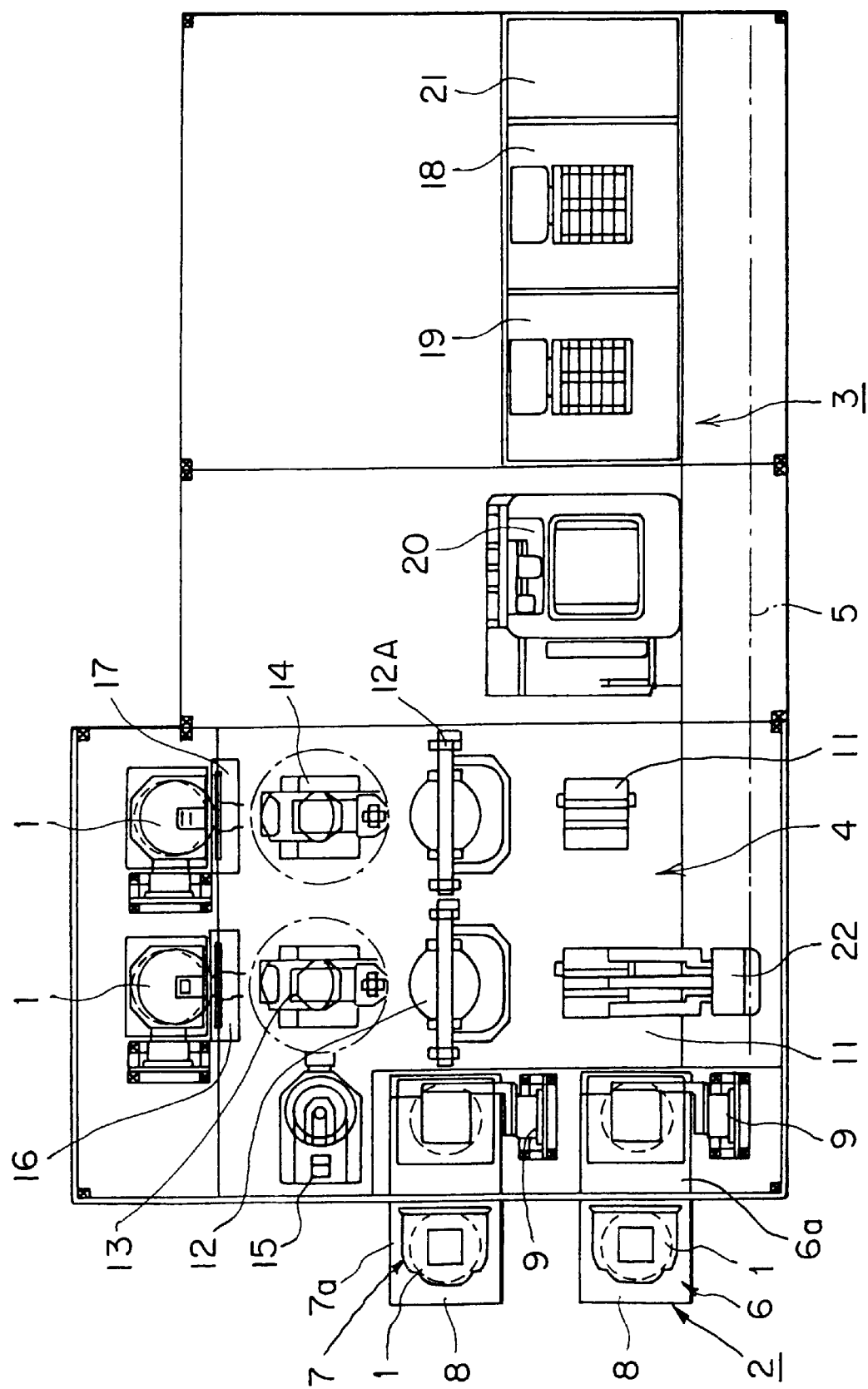
FIG. 1 is a schematic plan view of a cleaning/drying system to which the positioning device of this invention is applied.

Referring to FIGS. 1 and 2, this cleaning/drying system is provided with an inlet/outlet portion 2 for conveying carriers 1 into and out of the system, where each carrier 1 contains substrates to be processed which are semiconductor wafers W in a horizontal state; a processing portion 3 for processing the wafers W with chemicals or cleaning fluids and then drying them; and an interface portion 4 located between the inlet/outlet portion 2 and the processing portion 3, for receiving the wafers W, adjusting the positions thereof, and changing the attitudes thereof. A conveyor path 5 connects the processing portion 3 to the interface portion 4.

The inlet/outlet portion 2 is provided with an inlet portion 6 and an outlet portion 7 aligned along one side edge portion of the cleaning/drying system. The inlet portion 6 and outlet portion 7 are provided with an inlet port 6a and an outlet port 7a, respectively, for the carriers 1. Each of the inlet portion 6 and the outlet portion 7 is also provided with a mounting table 8 that is free to slide into and out of the corresponding port.

Each of the inlet portion 6 and the outlet portion 7 is further provided with a carrier lifter 9. Each carrier lifter 9 transfers a carrier 1 containing wafers W to a carrier standby portion 10 provided in an upper portion of the interface portion 4, or transfers an empty carrier 1 that is in the carrier standby portion 10.

A carrier transfer robot (not shown in the figure) is provided within the carrier standby portion 10. This carrier transfer robot takes a carrier 1 that has been conveyed into the carrier standby portion 10 and contains wafers W and conveys it to a rearward side of the carrier standby portion 10.

A first attitude modification device 12 and a second attitude modification device 12A are disposed in parallel on sliders 11 at positions corresponding to the conveyor path 5.

A wafer removal arm 13 and a wafer accommodation arm 14 are disposed in parallel on rearward sides of the first and second attitude modification devices 12 and 12A, respectively.

Each arm is capable of horizontal movement (in the X and Y directions), vertical movement (in the Z direction), and rotation (about the θ axis).

The removal arm 13 has a plurality of arm elements, each of which holds a wafer W respectively. However, the arm 13 may be of a type which has only one arm.

To one side of the wafer removal arm 13 is disposed the positioning device of the present invention, in other words, a notch aligner 15.

An incoming carrier lifter 16 and an outgoing carrier lifter 17 are disposed at positions corresponding to the wafer removal arm 13 and the wafer accommodation arm 14, respectively. These lifters 16 and 17 transfer carriers 1 from and to the carrier standby portion 10.

A first processing unit 18 that removes particles and organic contaminants adhering to the wafers W, a second processing unit 19 that removes metallic contaminants adhering to the wafers W, a cleaning/drying unit 20 that removes oxides from the wafers W and is also provided with a drying device for drying the wafers W, and a chuck washing unit are disposed in line within the processing portion 3. A wafer conveyor arm 22 that is capable of horizontal movement (in the X and Y directions), vertical movement (in the Z direction), and rotation (about the θ axis) is disposed in a position corresponding to all of these units 18 to 21.

The operation of the positioning device of this invention will now be described in detail, with reference to FIGS. 3 to 13.

Figure 3:
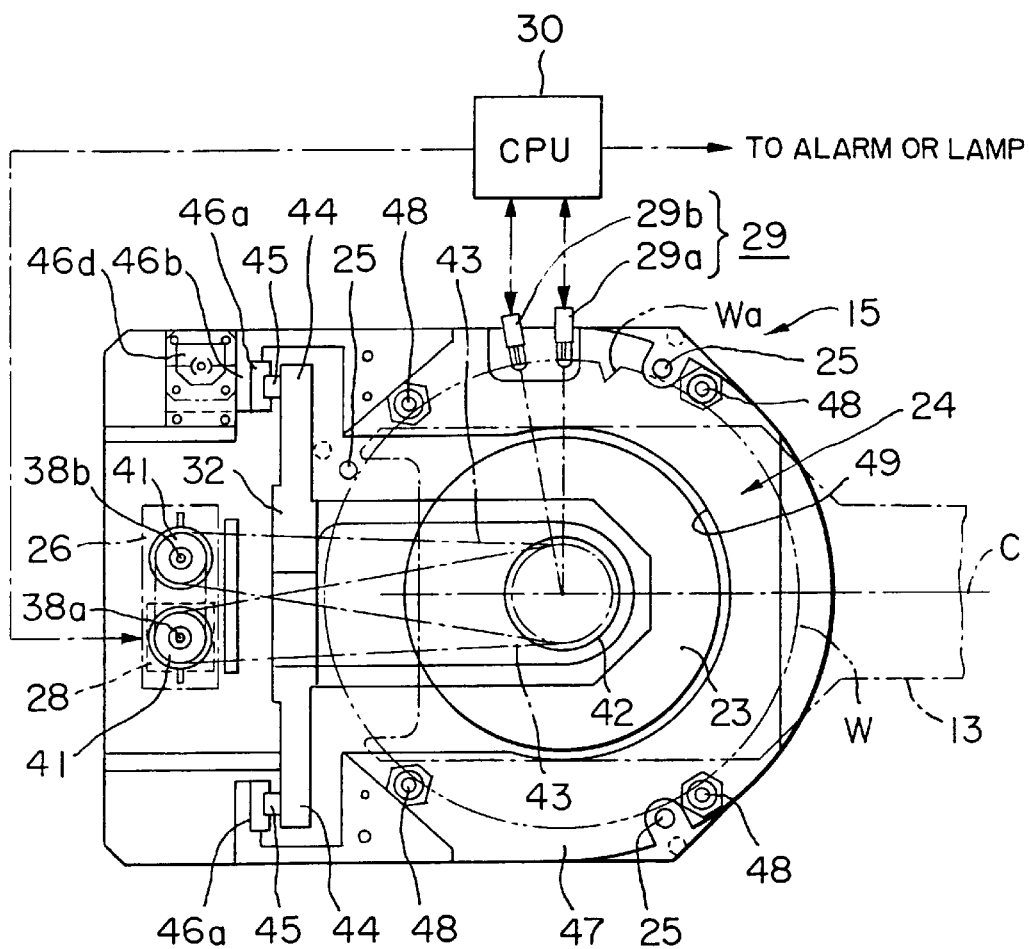
FIG. 3 is a plan view of essential components of the positioning device of this invention.

Referring to FIGS. 3 and 4, the positioning device (notch aligner) 15 is provided with a plurality of turntables 23 (seven in this embodiment) for mounting the wafers W, guides 24 between the turntables 23 for transferring the wafers W, a centering device 25 for centering the wafers W placed on the turntables 23, a single servo motor 28 that generates a driving force for rotationally driving the turntables 23, a driving-force transmission mechanism for transferring the driving-force of the servo motor 28 to the turntables 23, sensor devices 29 for detecting notches W$a$ formed in the wafers W, and a control device (that is, a CPU) 30 for controlling the driving-force transmission mechanism (particularly clutches 26 thereof) on the basis of detection signals from the sensor devices 29.

Figure 6:
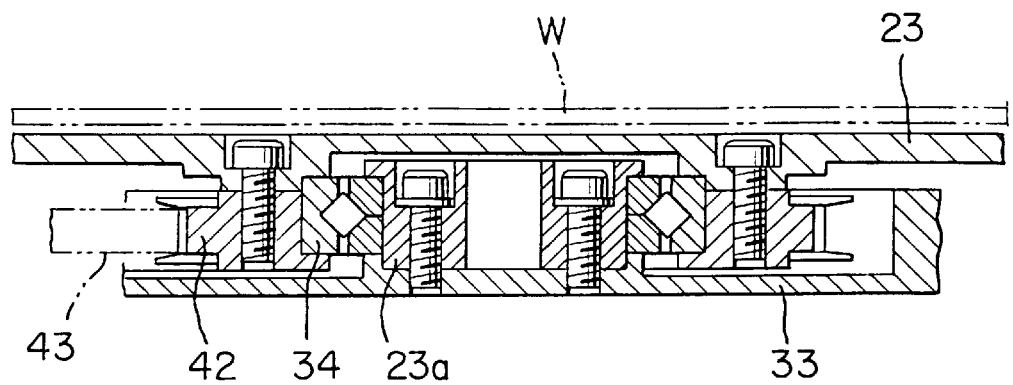
FIG. 6 is an enlarged cross-sectional view of the environs of the rotational shaft of the turntable shown in FIG. 5A.

The description below first concerns the turntables 23 and the attachment structure thereof. As shown in FIGS. 4 to 6, a support member 32 is erected on top of a base 31. Transfer cases 33 are disposed so as to protrude substantially horizontally from one side surface of the support member 32. Each of the turntables 23 is horizontally supported so as to be free to rotate by a shaft 23$a$ attached to each of these transfer cases 33, with a bearing 34 therebetween (see FIGS. 5 and 6). The turntables 23 are arranged at a predetermined spacing in the vertical direction and the rotational centers of the turntables 23 are positioned along a same vertical straight line.

The driving-force transmission mechanism for driving these turntables will now be described. As shown in FIG. 4, brackets 35 are provided protruding substantially horizontally from another side surface of the support member 32 and an attachment member 36 is provided vertically on these brackets 35. Two parallel rotational shafts 38$a$ and 38$b$ are supported vertically in a freely rotatable manner by bearings 37 on the attachment member 36.

Figure 7:
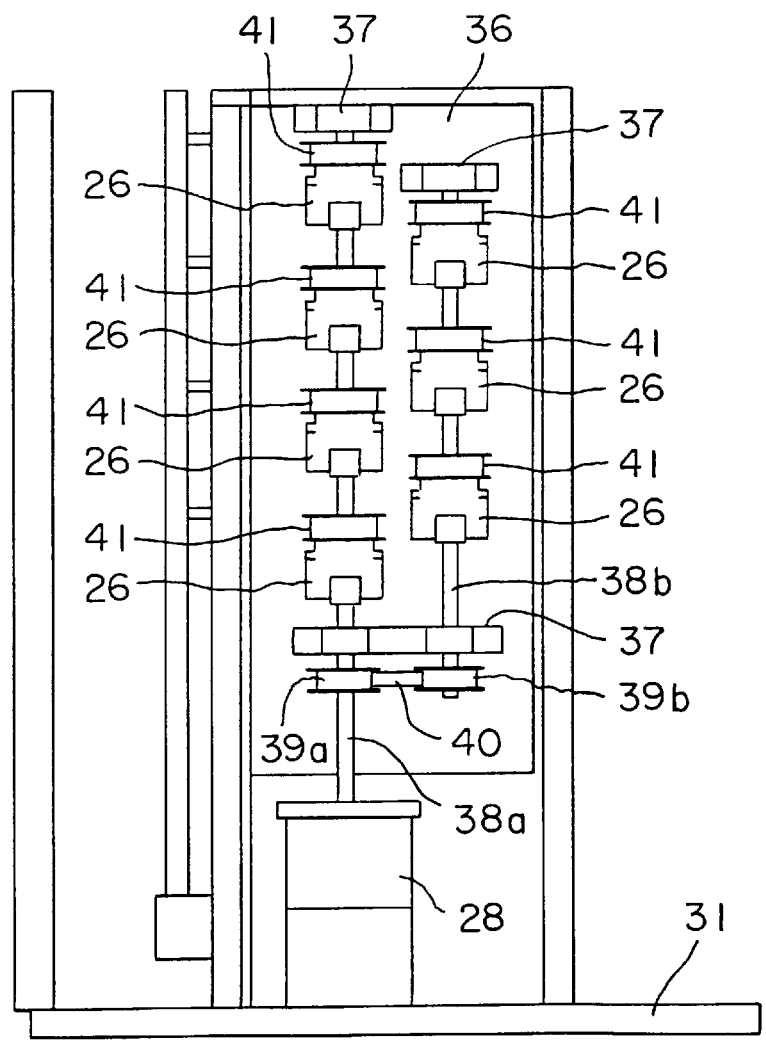
FIG. 7 is a schematic plan view of the mechanism for apportioning the driving force to the turntables in the positioning device of FIG. 3.

As shown in FIGS. 4 and 7, the servo motor 28 is connected to a lower portion of one rotational shaft 38a of these rotational shafts 38a and 38b. Pulleys 39a and 39b are attached to the rotational shafts 38a and 38b, respectively. A timing belt 40 is passed around these pulleys 39a and 39b in such a mannner that the rotation of the servo motor 28 is transmitted to the rotational shaft 38b.

As shown in FIG. 7, four clutches 26 and drive pulleys 41 are attached at a predetermined pitch to the rotational shaft 38a. Three clutches 26 and drive pulleys 41 are attached to the other rotational shaft 38b, at positions that are half a pitch displaced from those of the clutches 26 and drive pulleys 41 attached to the rotational shaft 38a. An input side of each clutch 26 is fixed to the rotational shaft, and an output side of each clutch 26 is fixed to the drive pulley 41. A driven pulley 42 is attached to a boss portion of each of the turntables 23. A timing belt 43 is passed around each of the drive pulleys 41 and the driven pulley 42 of the turntable 23 that is positioned at the heightwise position corresponding thereto.

The above described attachment of the clutches 26 and drive pulleys 41 at different heights on the two rotational shafts 38a and 38b makes it possible to arrange the clutches 26 and drive pulleys 41 at a spacing that is tighter in the vertical direction, which in turn makes it possible to reduce the spacing between the turntables 23 in the vertical direction. This enables a more compact apparatus.

Note that in the specification and attached claims of this document, the word "clutch" refers to a device that is capable of interrupting and connecting a driving force from an input side (such as an input shaft) to an output side (such as an output shaft), and it may be of any type such as mechanical type, hydraulic type, electrical type, and electromagnetic type.

Figure 8:
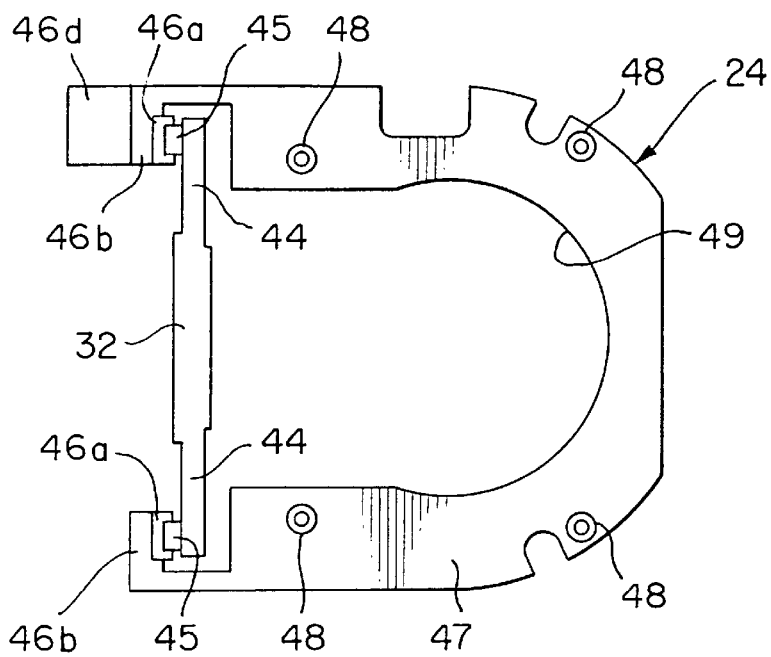
FIG. 8 is a plan view of one of the guides of the positioning device of FIG. 3.
Figure 9:
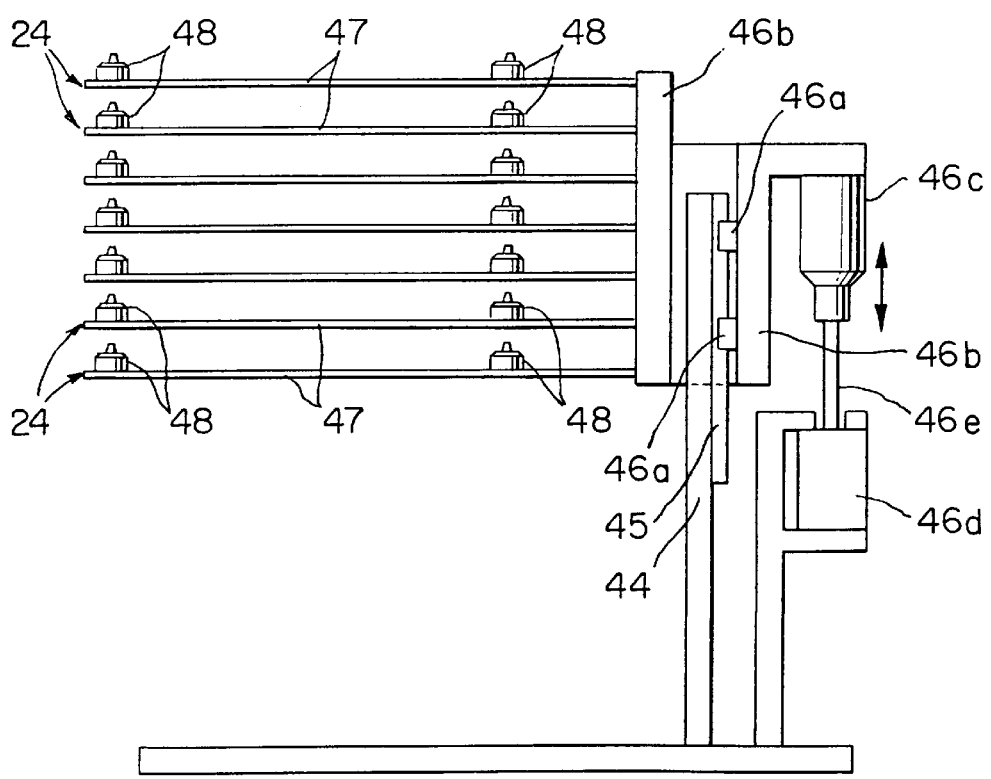
FIG. 9 is a side view of the arrangement of the guides of FIG. 3 and the drive mechanism for the guides.

Guides 24 will now be described with reference to FIGS. 3, 8, and 9. Each of these guides 24 has a substantially U-shaped guide plate 47, which is capable of moving in the vertical direction, and support protrusions 48 for supporting a wafer which are provided protruding from a plurality of locations, such as four locations, on a concentric circle on the guide plate 47 (more specifically, on the outer side of a concentric circle of a diameter that is slightly larger than the outer diameter of the wafer). Linear rails 45, each of which extends in the vertical direction, are provided on support portions 44 extending outward from both sides of the support member 32. All of the guides 24 are fixed to a movable body 46b having sliding pieces 46a that slidably engage with the linear rails 45. A piston rod 46e of a vertical air cylinder 46d is linked by a joint 46c to the movable body 46b. The guides 24 move relative to the turntables 23 in accordance with the movement of the piston rod 46e.

An internal space 49 of each guide plate 47 is provided with a circular arc portion of a diameter greater than the outer diameter of the turntables 23, so as not to impede the turntables 23. The distance between two groups of the support protrusions 48 which are symmetrical about a center line C, as shown in FIG. 3, is formed to be greater than the lateral width of the wafer removal arm 13.

Since the support protrusions 48 of each guide 24 come into contact with the wafers W, they are formed of a material that does not damage the wafers W, such as polyether etherketone (PEEK). Each support protrusion 48 has a large-diameter columnar portion 48a and a tapered protrusion portion 48d of a diameter smaller than that of the large-diameter columnar portion 48a, as shown enlarged in FIG. 5b. A wafer W is supported on an upper surface 48c of the large-diameter columnar portion 48a. A beveled portion 48b is provided on an upper edge of the large-diameter columnar portion 48a. A vertical surface 48e is provided at a base edge portion of the tapered protrusion portion 48d to prevent twisting due to contact with the edge portion of the wafer W.

In a standby state in which the guide 24 is not supporting a wafer W, the tapered protrusion portion 48d of each support protrusion 48 protrudes higher than a wafer placed on the corresponding turntable 23. This ensures that the tapered protrusion portions 48d prevent the wafer W from falling off if the wafer W should move because of any kind of shock or the like.

Providing the guides 24 of the above configuration makes it possible to smoothly perform the transfer of each wafer to a turntable before the positioning and also remove each wafer from the corresponding turntable after the positioning. This is intended to shorten the time required for setting the substrates for positioning, and also makes it possible to shorten the time required for removing the substrates after the positioning, thus making it possible to improve the efficiency of the positioning.

Figure 10A:
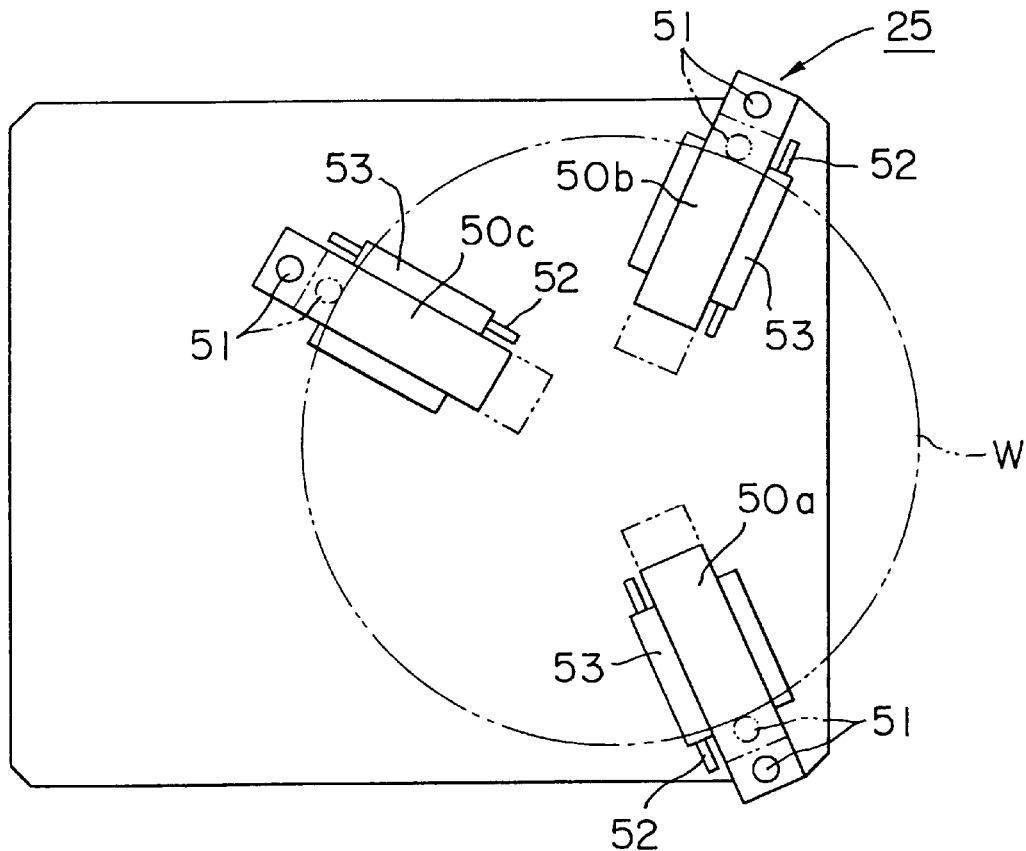
FIG. 10A is a schematic plan view of the centering device of the positioning device of FIG. 3
Figure 10B:
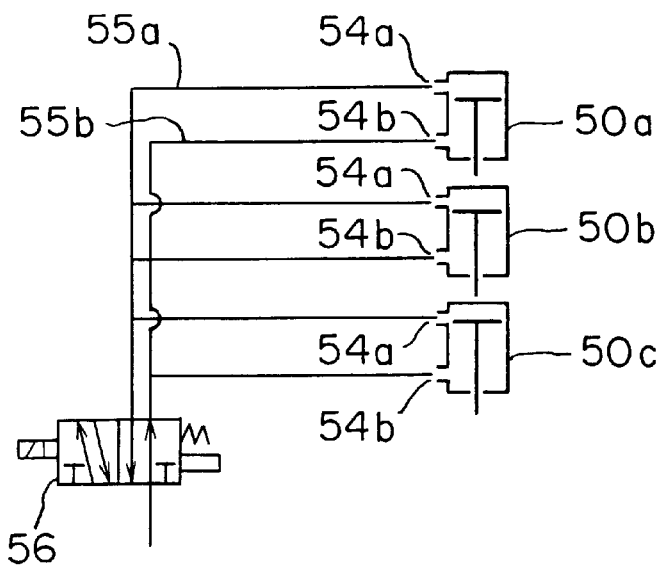
FIG. 10B shows the pressure piping for driving the centering device.
Figure 11:
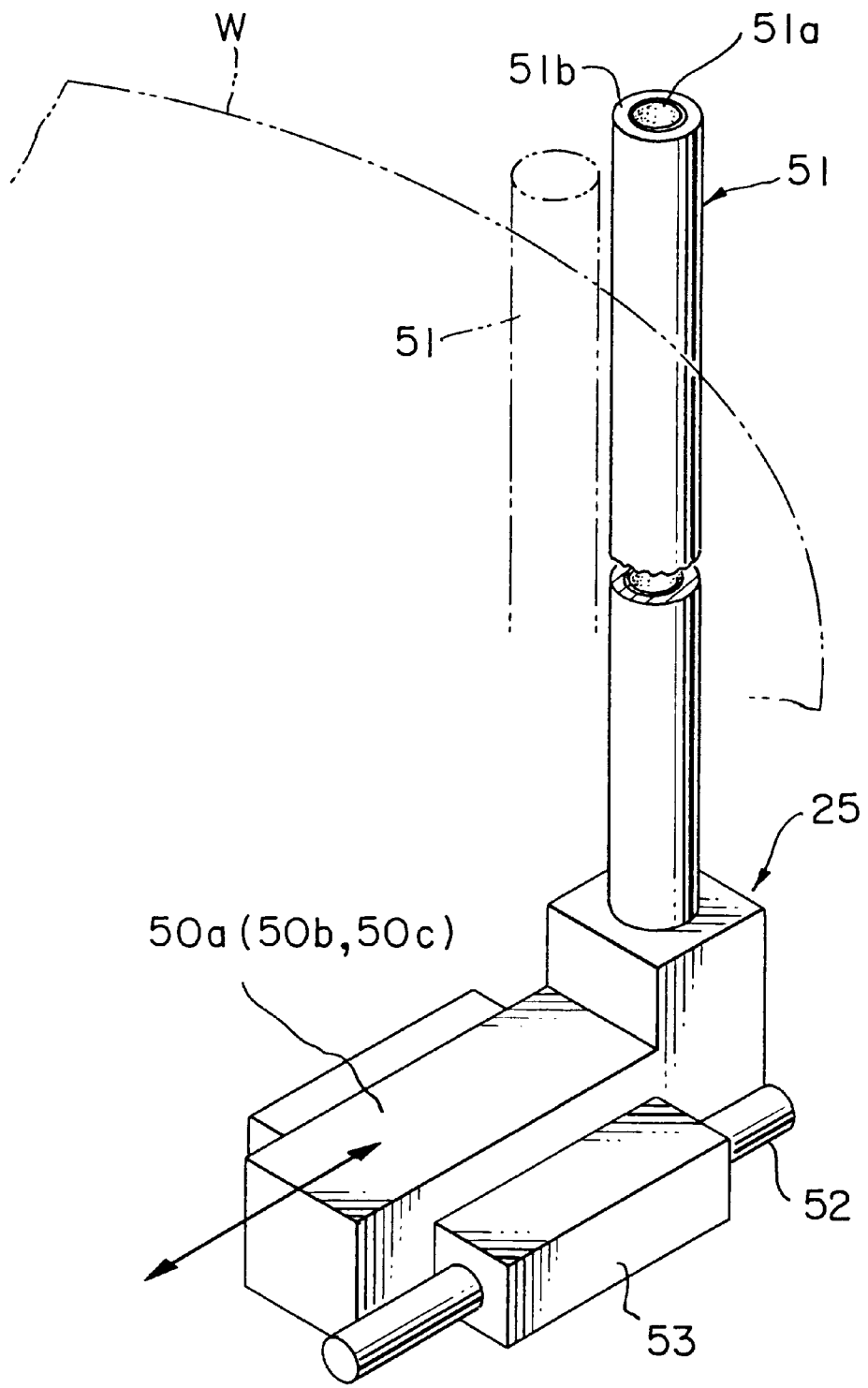
FIG. 11 is an enlarged perspective view of part of the centering vice of FIG. 10A.

The description now turns to the centering device 25, with special reference to FIGS. 3, 10, and 11. The centering device 25 has cylinder bodies 50a, 50b, and 50c, which are provided at three locations on a circle on the base 31 that is concentric with the center of rotation of the turntables 23 and which are movable in the radial direction thereof. Each of the cylinder bodies 50a, 50b, and 50c has a centering rod 51 on an upper surface of the tip end thereof. As shown in FIG. 11, each of the centering rods 51 has an outer sheathing 51b made of polyether etherketone (PEEK) on the surface of a stainless steel central rod 51a, to ensure that the wafer W is not damaged thereby.

Referring to FIG. 10A, on one side of each of the cylinder bodies 50a, 50b, and 50c is provided a guide 53 that engages in a freely slidable manner with a guide rail 52 that is suspended by a fixed member (not shown in the figure) on the side of a frame. Each of the cylinder bodies 50a, 50b, and 50c is provided with a primary-side port 54a and a secondary-side port 54b, as shown in FIG. 10b. A first supply pipeline 55a is connected to all the primary-side ports 54a and a second supply pipeline 55b is connected to all the secondary-side ports 54b. The first supply pipeline 55a and second supply pipeline 55b are connected to an air supply source (not shown in the figure) by a switching valve 56. If the switching valve 56 is switched so that the three cylinder bodies 50a, 50b, and 50c are made to move simultaneously in the radial direction, the three centering rods 51 come into contact with the wafer W placed on that turntable 23, which centers the wafer W.

Note that it is sufficient to control the position at at least three locations on the peripheral edge portion of the wafer W, in order to perform the centering. It is therefore sufficient to provide three centering rods 51, or rather, cylinder bodies, although it is also possible to provide more than three.

Figure 12:
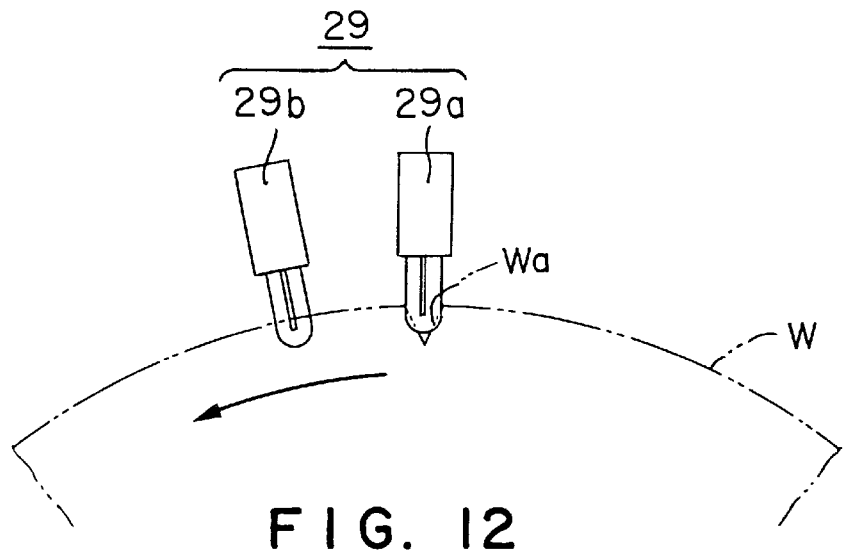
FIG. 12 is a plan view illustrative of the method of positioning substrates.

The description now turns to the sensor device 29 for detecting the notch (a cut-away portion) Wain each wafer W, with reference to FIGS. 3 and 12. A sensor device 29 is provided to correspond to each of the turntables 23. Since seven of these turntables 23 are provided in this embodiment, seven sensor devices 29 are provided therefor. Each of the sensor devices 29 has a pair of sensor elements 29a and 29b. These sensor elements 29a and 29b are disposed at positions in close proximity to the peripheral edge of a wafer W, when that wafer W has been placed upon the corresponding turntable 23. The sensor elements 29*a* and 29*b* of the sensor device 29 are disposed at a predetermined spacing in the peripheral direction. The sensor elements 29*a* of all the sensor devices 29 are positioned along the same vertical line, and the sensor elements 29*b* of all the sensor devices 29 are also all positioned along another vertical line.

The sensor devices 29 are connected to the CPU (i.e. control device) and each sends a detection signal to the CPU 30 when it detects the notch in a wafer W. The CPU 30 compares this detection signal with previously stored data, and functions to disengage the corresponding clutch 26 by sending an output signal thereto. The CPU 30 also controls the operation and halting of the servo motor 28.

The description now concerns the positioning method enabled by the positioning device 15 of the above described configuration, First of all, the guides 24 are placed on standby at positions lower than the turntables 23, as shown by solid lines in FIGS. 4 and 5. In this state, a plurality of wafers W, such as seven wafers, that are arranged at a predetermined pitch are held by the wafer removal arm 13 and transferred to above the turntables 23.

The guides 24 are then raised so that the upper surfaces 48*c* of the support protrusions 48 engage with the peripheral edges of the wafers W. When the guides 24 are subsequently raised further, the guides 24 pick up the wafers W.

After the wafers W have been transferred to the guides 24, the wafer removal arm 13 retreats from above the turntables 23. After the wafer removal arm 13 has retreated, the elevator device operates in reverse to lower the guides 24 and thus place the wafers W that are supported by the support protrusions 48 of the guides 24 onto the turntables 23.

The centering device 25 is next driven to move the centering rods 51 simultaneously inwards and thus center the wafers W. After the centering, the centering rods 51 return to standby positions.

The servo motor 28 then starts to operate with all of the clutches 26 in an engaged state. Thus all of the turntables 23, and therefore all of the wafers W on the turntables 23, start to rotate simultaneously. Note that it is necessary to operate the servo motor 28 for at least one complete rotation of the turntables 23 (such as through 370 degrees).

When each sensor element 29*a* detects a notch W*a* in the corresponding wafer W, a detection signal is sent to the CPU 30 therefrom. Either as soon as a notch W*a* has been detected or after the servo motor 28 has operated for a predetermined number of pulses after the detection of the notch W*a*, the CPU 30 disengages the clutch 26 corresponding to the turntable 23. This halts that turntable 23.

If the sensor element 29*b* does not detect the notch W*a* within a predetermined time (such as 1 to 2 seconds) after the corresponding sensor element 29*a* has detected it, the determination is that the notch W*a* is positioned between the sensor elements 29*a* and 29*b*.

Note that, if the sensor elements 29*a* and 29*b* have both detected the notch W*a*, the corresponding clutch 26 remains disengaged until the servo motor 28 halts.

The rotation of all the turntables 23 is sequentially stopped by sequentially disengaging the clutches 26 in this manner. After the servo motor 28 has operated a predetermined amount (an amount equivalent to a rotation through 370 degrees of the turntables 23), the servo motor 28 is halted.

If there is a turntable 23 at which both of the sensor elements 29*a* and 29*b* have detected a notch W*a*, the clutch 26 corresponding to that turntable 23 is again engaged and the servo motor 28 is again driven to rotate that turntable 23. When the sensor element 29*a* has detected the notch W*a* in the above described manner, the clutch 26 is disengaged.

Note that if both of the sensor elements 29*a* and 29*b* again detect the notch W*a*, the CPU 30 sends a signal to a display device such as an alarm or lamp (not shown in the figure) to indicate that fact.

As described above, if the notches W*a* have been detected on all of the turntables 23 by the sensor elements 29*a* but not by the sensor element 29*b*, the positioning of the wafers ends. The use of two sensor elements as described above makes it possible to increase the accuracy of the positioning.

After this positioning has ended, all the clutches 26 are engaged and the servo motor 28 is operated for a predetermined number of pulses so that the notches W*a* are moved rotationally to a predetermined location.

Then the guides 24 are raised, and the wafers W placed on the turntables 23 are thereby picked up by the support protrusions 48 of the guides 24. In this state, the wafer removal arm 13 is inserted below the wafers W. The guides 24 are then lowered so that the wafers W supported on the guides 24 are transferred to the wafer removal arm 13. The wafer removal arm 13 carrying the wafers W then retreats from above the turntables 23, and the wafers W are conveyed thereby to the first attitude modification device 12. The attitude of the wafers W is modified by the first attitude modification device 12 to a vertical state.

Note that the description of the above embodiment related to a positioning case in which a notch W*a* is detected by a sensor element 29*a* but is not detected by the sensor element 29*b*. However, the positioning could be done by the method described below instead.

Figure 13:
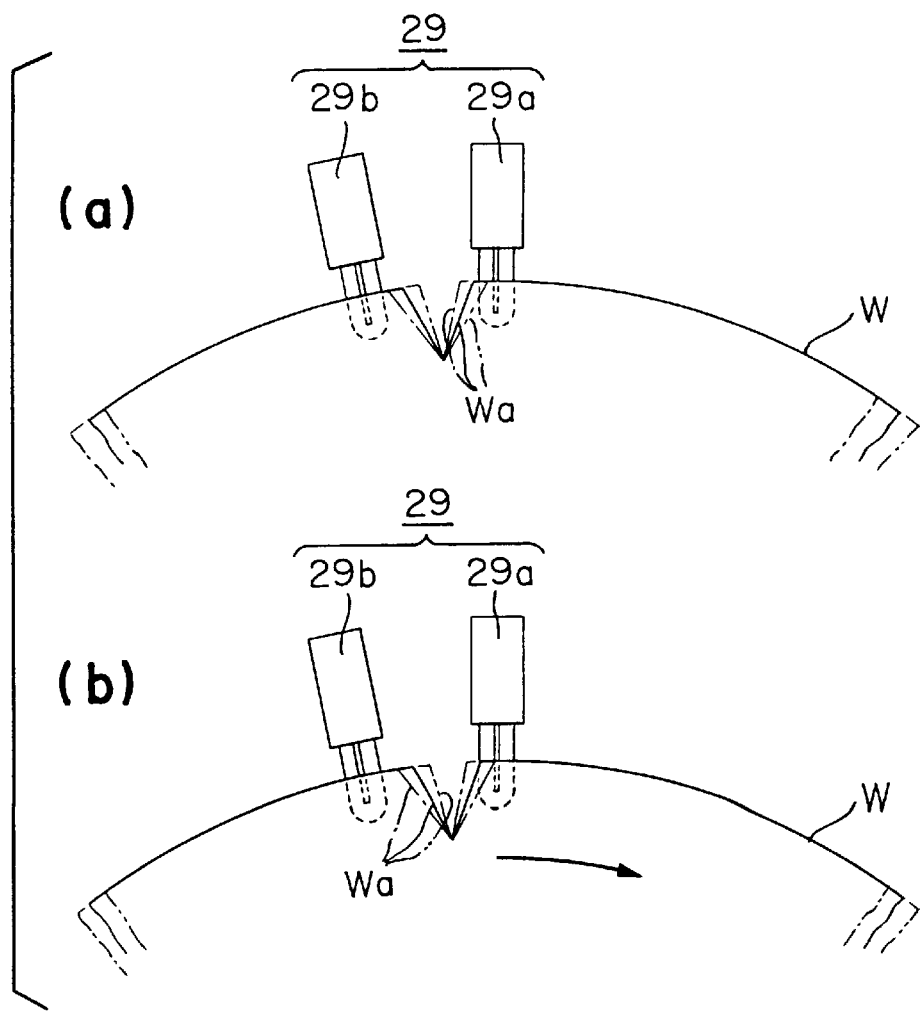
FIGS. 13A and 13B are a plan view illustrative of another method of positioning substrates.

In other words, after a notch W*a* has been detected by the sensor element 29*a* but not by the sensor element 29*b* at each turntables, as shown in FIG. 13, all of the clutches 26 are engaged and all the wafers W that have been positioned are rotated at a rotational speed that is slower (ultra-low speed) than the rotational speed used during the initial positioning process, either in the same direction or in the opposite direction (FIG. 13 shows rotation in the opposite direction). Note that the timing at which each clutch 26 is disengaged in this case is after the sensor element 29*a* has detected a corner portion of a notch W*a* when the turntables 23 are rotating in the opposite direction, Or after the sensor element 29*b* has detected a corner portion of a notch W*a* when the turntables 23 are rotating in the same direction.

It is therefore possible to prevent misalignment of the positions of the notches W*a* of the wafers W due to slipping or the like, by rotating the wafers W again after the initial positioning, at a low speed to reposition them. This also enables more accurate positioning.

Note that the above embodiment was described with reference to a case in which the "cut-away portion" was a "notch", but it should be obvious that similar positioning can be done even if a cut-away portion that is not a notch, such as an "orientation flat", is provided.

In addition, the description of the above embodiment concerned the application of the positioning device of this invention to a system for washing and drying semiconductor wafers, but it should be obvious that it can be applied to any other type of processing system other than a washing system, and it can also be applied to circular substrates other than semiconductor wafers.

What is claimed is:

1. A positioning device for positioning a plurality of substrates, each having a cut-away portion in a peripheral edge thereof, said positioning device comprising:

a plurality of turntables disposed at a predetermined spacing in a vertical direction, on each of which is to be placed one of said substrates;

a centering device for centering said substrates placed on said turntables;

a drive motor for generating a driving force for rotationally driving said turntables;

a driving-force transmission mechanism for transferring said driving force generated by said drive motor to each of said turntables, said driving-force transmission mechanism including a plurality of clutches provided in correspondence with said turntables in such a manner that said clutches are capable of independently interrupting and connecting said driving force with respect to each of said turntables;

a plurality of sensor devices disposed in the vicinity of peripheral edges of said substrates when said substrates are placed on said turntables, for detecting said cut-away portion of said substrates; and a control device for controlling said clutches on the basis of detection signals from said sensors.

2. The positioning device according to claim 1, wherein each of said sensor devices is provided with two sensor elements arranged at a predetermined spacing in the peripheral direction of said turntables.

3. The positioning device according to claim 1, wherein said drive motor is capable of operating in a positive direction and a negative direction.

4. The positioning device according to claim 1, wherein said driving-force transmission mechanism further includes:

a rotational shaft disposed apart from said turntables in a radial direction of said turntables and extending in the vertical direction, said rotational shaft being driven by said drive motor, a plurality of drive pulleys connected to output sides of said clutches, and a plurality of belts for transmitting said driving force between respective ones of said drive pulleys and said turntables, wherein said clutches are disposed on said rotational shaft at a predetermined spacing in the vertical direction, input sides of said clutches being connected to said rotational shaft.

5. The positioning device according to claim 1, wherein said driving-force transmission mechanism further includes:

a plurality of rotational shafts disposed apart from said turntables in a radial direction of said turntables and extending in the vertical direction, said rotational shafts being driven by said drive motor, a plurality of drive pulleys connected to output sides of said clutches, and a plurality of belts for transmitting a driving force between respective ones of said drive pulleys and said turntables, wherein said clutches are disposed on said rotational shafts at a predetermined spacing in the vertical direction, input sides of said clutches being connected to said rotational shafts, and wherein said clutches and said drive pulleys provided at one of said rotational shafts are disposed at heightwise positions that differ from those of clutches and drive pulleys provided at an adjacent rotational shaft.

6. The positioning device according to claim 1, wherein said centering device is provided with at least three positioning elements capable of moving in the radial direction of said turntables, whereby said substrates placed on said turntables are centered by said positioning elements coming into contact with peripheral edges of said substrates.

7. The positioning device according to claim 1, further comprising guides movable relative to said turntables, for transferring said substrates to and from said turntables.

8. The positioning device according to claim 1, wherein said cut-away portion is a notch.

9. The positioning device according to claim 1, wherein said cut-away portion is an orientation flat.

10. A method of positioning a plurality of substrates, each having a cut-away portion in a peripheral edge thereof, said method comprising the steps of:

placing and centering said substrate on each of a plurality of turntables;

transmitting a driving force of one drive motor to said turntables, to cause said turntables to rotate;

detecting said cut-away portion of said substrate on each of said turntables; and interrupting the transmission of said driving force from said drive motor to one of said turntables on which is placed a substrate wherein said cut-away portion has been detected, to halt the rotation of said one of said turntables.

11. The positioning method according to claim 10, further comprising the step of:

transmitting said driving force of said drive motor to all of said turntables to rotate all of said turntables through a fixed angle, after all of said turntables have been halted.

12. A method of positioning a plurality of substrates, each having a cut-away portion in a peripheral edge thereof, said method comprising the steps of:

placing and centering a substrate on each of a plurality of turntables;

transmitting a driving force of one drive motor to said turntables, to cause said turntables to rotate at a first rotational speed;

detecting said cut-away portion of said substrates on each of said turntables at the first rotational speed;

interrupting the transmission of said driving force from said drive motor to one of said turntables rotating at the first rotational speed on which is placed a substrate wherein said cut-away portion has been detected, to halt the rotation said one of said turntables;

transmitting said driving force of said drive motor to said turntables to rotate all of said turntables at a second rotational speed that is slower than said first rotational speed, after all of said turntables have been halted;

detecting said cut-away portion of said substrates on each of said turntables rotating at the second rotational speed; and interrupting the transmission of said driving force from said drive motor to one of said turntables rotating at the second rotational speed on which is placed a substrate wherein said cut-away portion has been detected, to halt the rotation of said one of said turntables.

13. The positioning method according to claim 12, wherein a direction of rotation of said turntables when rotating at said second rotational speed is opposite to a direction of rotation of said turntables when rotating at said first rotational speed.

14. The positioning method according to claim 12, further comprising the step of:

transmitting said driving force of said motor to said turntables to rotate all of said turntables through a fixed angle, after all of said turntables that are rotating at said second rotational speed have been halted.

* * * * *